United States Patent
Oomori et al.

(10) Patent No.: US 9,977,204 B2
(45) Date of Patent: May 22, 2018

(54) OPTICAL APPARATUS, PRINTED CIRCUIT BOARD

(71) Applicant: SUMITOMO ELECTRIC INDUSTRIES, LTD., Osaka (JP)

(72) Inventors: Kaoru Oomori, Yokohama (JP); Takashi Kojima, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days. days.

(21) Appl. No.: 15/280,789

(22) Filed: Sep. 29, 2016

(65) Prior Publication Data

US 2017/0097479 A1    Apr. 6, 2017

(30) Foreign Application Priority Data

Oct. 1, 2015   (JP) .................................. 2015-196020

(51) Int. Cl.
| | |
|---|---|
| G02B 6/42 | (2006.01) |
| G02B 6/12 | (2006.01) |
| H05K 1/02 | (2006.01) |
| H05K 1/18 | (2006.01) |
| G02B 6/43 | (2006.01) |

(52) U.S. Cl.
CPC ......... *G02B 6/428* (2013.01); *G02B 6/12004* (2013.01); *G02B 6/4292* (2013.01); *G02B 6/43* (2013.01); *H05K 1/0274* (2013.01); *H05K 1/0298* (2013.01); *H05K 1/182* (2013.01); *H05K 1/183* (2013.01); *G02B 2006/12123* (2013.01); *G02B 2006/12142* (2013.01); *H05K 2201/10121* (2013.01); *H05K 2201/10151* (2013.01); *H05K 2201/10553* (2013.01); *H05K 2203/049* (2013.01)

(58) Field of Classification Search
CPC .............................. G02B 6/428; H05K 1/184
See application file for complete search history.

(56) References Cited

U.S. PATENT DOCUMENTS

| | | | |
|---|---|---|---|
| 5,123,066 A | 6/1992 | Acarlar | |
| 5,353,364 A | 10/1994 | Kurashima | |
| 5,521,992 A | 5/1996 | Chun et al. | |
| 5,856,913 A * | 1/1999 | Heilbronner | H01L 23/3164 174/250 |
| 7,957,154 B2 * | 6/2011 | Ito | H01L 23/49822 361/763 |

(Continued)

FOREIGN PATENT DOCUMENTS

JP    2008-091522    4/2008

OTHER PUBLICATIONS

Office Action for U.S. Appl. No. 15/280,740 dated Jul. 28, 2017.
Office Action for U.S. Appl. No. 15/280,740 dated Oct. 20, 2017.

*Primary Examiner* — Daniel Petkovsek
(74) *Attorney, Agent, or Firm* — Smith, Gambrell & Russell, LLP.

(57) ABSTRACT

A printed circuit board includes a main body of laminate structures, and a metal piece. The main body has a first opening and a second opening. The metal piece is held by the laminate structures of the main body. The metal piece has a first face and a second face opposite to the first face. The first opening and the second opening respectively extend to the first face and the second face of the metal piece. A semiconductor optical device can be mounted on the first face of the metal piece, in the first opening.

1 Claim, 12 Drawing Sheets

(56) References Cited

U.S. PATENT DOCUMENTS

| | | |
|---|---|---|
| 8,382,384 B2 | 2/2013 | Nekado et al. |
| 9,031,361 B2 | 5/2015 | Yu et al. |
| 2017/0097478 A1* | 4/2017 | Oomori .................. G02B 6/428 |
| 2017/0097479 A1 | 4/2017 | Oomori et al. |

* cited by examiner

OPTICAL APPARATUS, PRINTED CIRCUIT BOARD

BACKGROUND OF THE INVENTION

Field of the Invention

The present invention relates to an optical apparatus, and a printed circuit board. This application claims the benefit of priority from Japanese Patent Application No. 2015-196020 filed on Oct. 1, 2015, which is herein incorporated by reference in its entirety.

Related Background Art

Japanese Patent Publication Laid Open No. 2008-91522 (referred to as "Patent Document 1") discloses a printed circuit board.

SUMMARY OF THE INVENTION

One aspect of the present invention is a printed circuit board which includes: a first laminate structure including a first dielectric core layer, and a first metal layer for grounding or wiring, and the first metal layer thereof being disposed on the first dielectric core layer thereof, the first laminate structure having a first opening; a second laminate structure including a first dielectric core layer, and a first metal layer for grounding or wiring, the second metal layer being disposed on the first dielectric core layer thereof, the second laminate structure having a second opening; and a metal piece having a first face and a second face opposite to the first face, the metal piece being held by the first laminate structure and the second laminate structure, the first laminate structure including pad electrodes arranged on a surface of the first laminate structure along an edge of the first opening, the metal piece being electrically isolated from the first laminate structure and the second laminate structure, the first opening of the first laminate structure, the metal piece, and the second opening of the second laminate structure being arranged in a direction of a first axis, and the first opening extending from the surface of the first laminate structure to the first face of the metal piece, and the second opening extending from a surface of the second laminate structure to the second face of the metal piece.

Another aspect of the present invention is an optical apparatus which includes: a semiconductor optical device integrating optical couplers, an optical element for processing a light beam associated with each of the optical couplers, and an electrical circuit for processing an electrical signal associated with the optical element; a printed circuit board electrically connected with the semiconductor optical device, the printed circuit board including a main body and a metal piece, the main body having a first opening and a second opening, and the metal piece being held by the main body; and a first electrical component mounted on the printed circuit board, the metal piece having a first face and a second face opposite to the first face, the first opening extending to the first face of the metal piece, and the second opening extending to the second face of the metal piece, and the semiconductor optical device being mounted on the first face of the metal piece in the first opening.

BRIEF DESCRIPTION OF THE DRAWINGS

The above-described objects and the other objects, features, and advantages of the present invention become more apparent from the following detailed description of the preferred embodiments of the present invention proceeding with reference to the attached drawings, which are.

DETAILED DESCRIPTION

Figure 1:
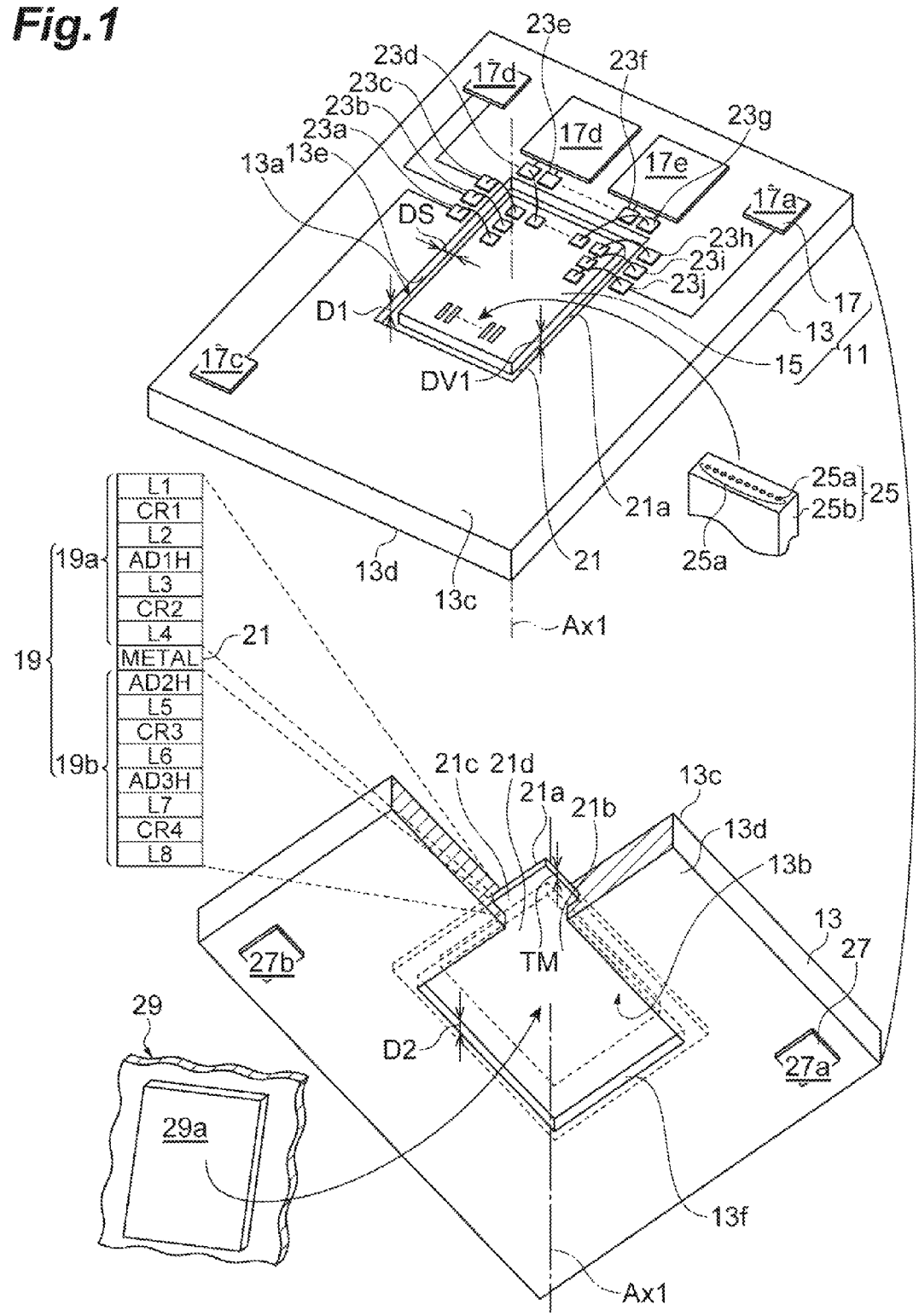
FIG. 1 is a schematic view showing the front and back faces of an optical apparatus, which includes an optical part, a printed circuit board, and a heat dissipating part, according to the present embodiment.

Patent Document 1 discloses a printed circuit board having a plurality of through-holes in an area for mounting electronic components. These through-holes receive the protrusions of a heat sink, which is inserted thereinto from the rear face of the printed circuit board, and the front ends of the protrusions project from the front face of the printed circuit board. The front end of each protrusion is in contact with an electronic component generating heat, which is released through the protrusion.

The front end protruding with respect to the front face of the printed circuit board forms a difference in level. The inventors have found that in the printed circuit board that contains a semiconductor optical device used as the electronic component, the difference in level interferes with the mounting of the device on the printed circuit board. What is needed is to reduce the difference in level around the area of the printed circuit board that mounts the semiconductor optical device.

It is an object according to one aspect of the present invention to provide a printed circuit board which provide a semiconductor optical device to be mounted thereon with a short heat dissipation path, and it is an object according to another aspect of the present invention to provide an optical apparatus including the above printed circuit board and a semiconductor optical device mounted thereon.

Specific embodiments according to the above aspects are described below.

An optical apparatus according to an embodiment includes: a semiconductor optical device integrating optical couplers, an optical element for processing a light beam associated with each of the optical couplers, and an electrical circuit for processing an electrical signal associated with the optical element; a printed circuit board electrically connected with the semiconductor optical device, the printed circuit board including a main body and a metal piece, the main body having a first opening and a second opening, and the metal piece being held by the main body; and a first electrical component mounted on the printed circuit board. The metal piece has a first face and a second face opposite to the first face. The first opening extends to the first face of the metal piece, and the second opening extends to the second face of the metal piece. The semiconductor optical device is mounted on the first face of the metal piece in the first opening.

The optical apparatus allows the first opening, the metal piece and the second opening to be arranged in the direction of an axis such that the main body of the printed circuit board to hold the metal piece. The printed circuit board has wiring layers and insulating layers disposed to go round the first opening and the second opening, so that the printed circuit board is provided with the metal piece, which is to mount a semiconductor optical device, with no change of the printed circuit board in thickness of the insulating layers and widths of the wiring layers, which may affect the electrical performance of the optical apparatus, in the main body of the printed circuit board. Further, the semiconductor optical device is mounted on the first face of the metal piece in the first opening of the printed circuit board, and the entire back face of the semiconductor optical device is supported by the first face of the metal piece. The second opening of the printed circuit board extends to the second face of the metal piece to allow heat to dissipate through the second face of the metal piece.

In the optical apparatus according to an embodiment, the main body of the printed circuit board includes a first laminate structure and a second laminate structure, the first laminate structure is provided with the first opening, and the second laminate structure being provided with the second opening. The first laminate structure, the metal piece and the second structure are arranged in the direction of the first axis, and the first laminate structure and the second laminate structure are disposed to hold the metal piece therebetween. The first laminate structure includes a first dielectric core layer, and a first metal layer for grounding or wiring, and the first metal layer is disposed on the first dielectric core layer, and the second laminate structure includes a first dielectric core layer, and a first metal layer for grounding or wiring, and the first metal layer is disposed on the first dielectric core layer.

The optical apparatus includes the arrangement of the first laminate structure, the metal piece and the second laminate structure in the direction of the first axis, such that the first laminate structure and the second laminate structure holds the metal piece. The printed circuit board incorporates the metal piece, allowing the mounting of a semiconductor device thereon, without significant change of the printed circuit board in thickness of insulating layers and widths of wiring layers, which may affect the electrical performance of the optical apparatus, in the main body of the printed circuit board.

The optical apparatus according to an embodiment, further includes an optical part having optical waveguides, and a holder holding the optical waveguides. The optical part is supported by the semiconductor optical device such that the optical waveguides are optically coupled with the optical couplers.

The optical apparatus allows the optical part to be supported by the semiconductor optical device so as to optically couple to the optical couplers in the semiconductor optical device.

The optical apparatus according to an embodiment further includes a heat dissipating part having a supporting surface, the supporting surface supports the second face of the metal piece in the second opening of the main body.

The optical apparatus allows the heat dissipating part to support the second face of the metal piece in the printed circuit board and the first supporting allows the semiconductor optical device to be mounted on the first face of the metal piece.

In the optical apparatus according to an embodiment, the semiconductor optical device includes at least one of a photodiode or a Mach-Zehnder modulator.

In the optical apparatus, the optical element and the electrical circuit generates heat during operation. The second opening of the second laminate structure extending to the second face of the metal pieces of the printed circuit board allows the heat to dissipate by way of the second face of the metal pieces.

A printed circuit board according to an embodiment includes: a first laminate structure including a first dielectric core layer, and a first metal layer for grounding or wiring, and the first metal layer thereof being disposed on the first dielectric core layer thereof, the first laminate structure having a first opening; a second laminate structure including a first dielectric core layer, and a first metal layer for grounding or wiring, the second metal layer being disposed on the first dielectric core layer thereof, the second laminate structure having a second opening; and a metal piece having a first face and a second face opposite to the first face, the metal piece being held by the first laminate structure and the second laminate structure. The first laminate structure includes pad electrodes arranged on a surface of the first laminate structure along an edge of the first opening. The metal piece is electrically isolated from the first laminate structure and the second laminate structure. The first opening of the first laminate structure, the metal piece, and the second opening of the second laminate structure are arranged in the direction of the first axis. The first opening extends from the surface of the first laminate structure to the first face of the metal piece, and the second opening extends from a surface of the second laminate structure to the second face of the metal piece.

The printed circuit board provides the first laminate structure with pad electrodes arranged around the first opening on the surface of the first laminate structure, and the pad electrodes can be electrically connected to the semiconductor optical device mounted on the first face of the metal piece in the first opening. In addition, the second opening extends from the back face of the second laminate structure to reach the second face of the metal piece, so that the metal piece allows heat from the semiconductor optical device to dissipate through the second face thereof.

The teachings of the present invention can be readily understood by considering the following detailed description with reference to the accompanying drawings shown as examples. Referring to the accompanying drawings, embodiments according to an optical apparatus, a printed circuit board, a method for fabricating a printed circuit board, and a method for fabricating an optical apparatus will be illustrated below. When possible, the same portions will be denoted by the same reference numerals.

Figure 2:
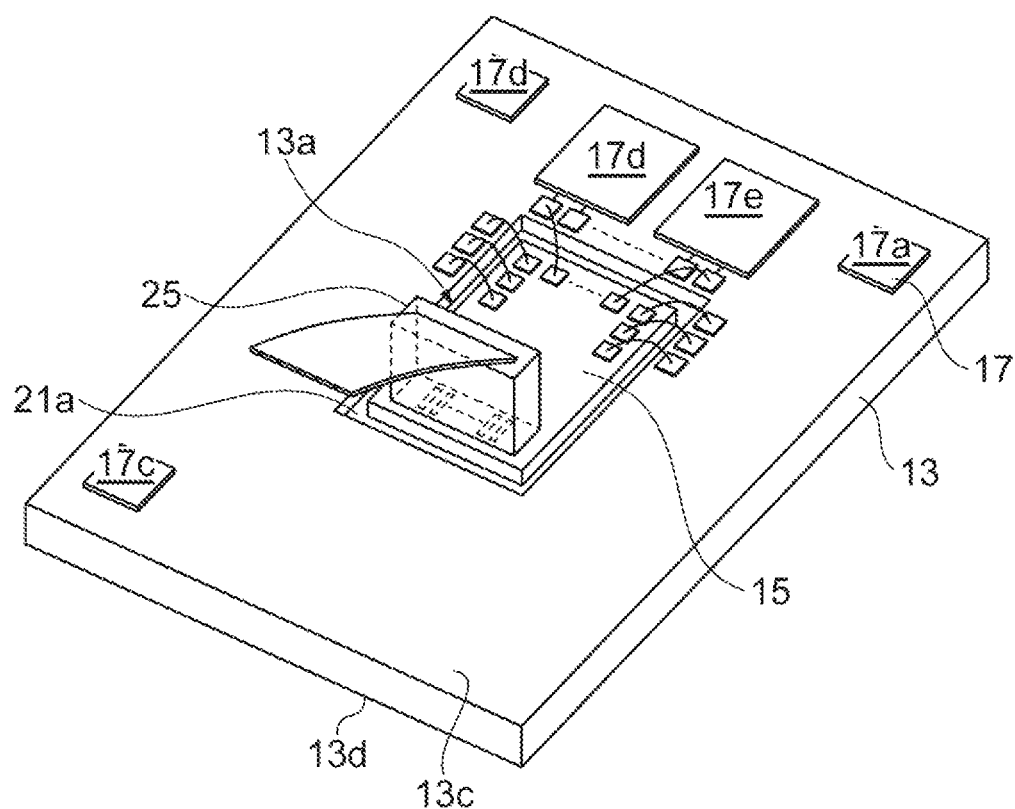
FIG. 2 is a schematic view showing the front face of the optical apparatus, which has been connected to an optical part, according to the present embodiment.
Figure 3:
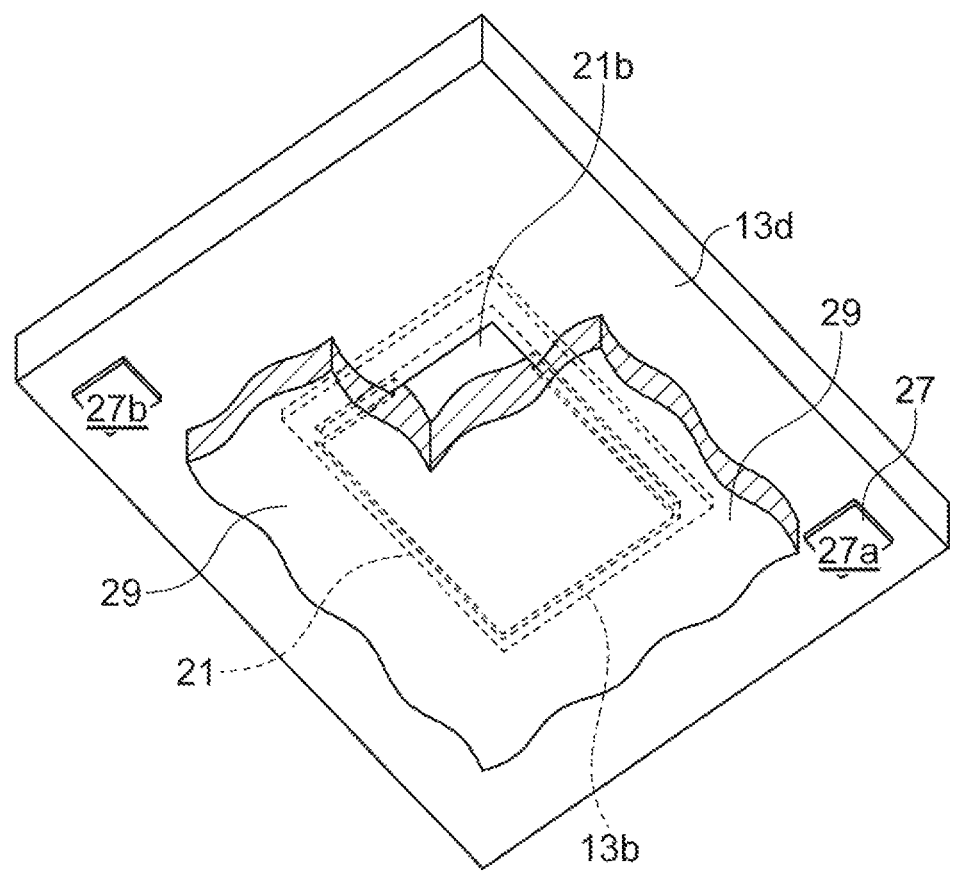
FIG. 3 is a schematic view showing the back face of the optical apparatus, which has been assembled with the heat dissipating part, according to the present embodiment.
Figures 4A, 4B:
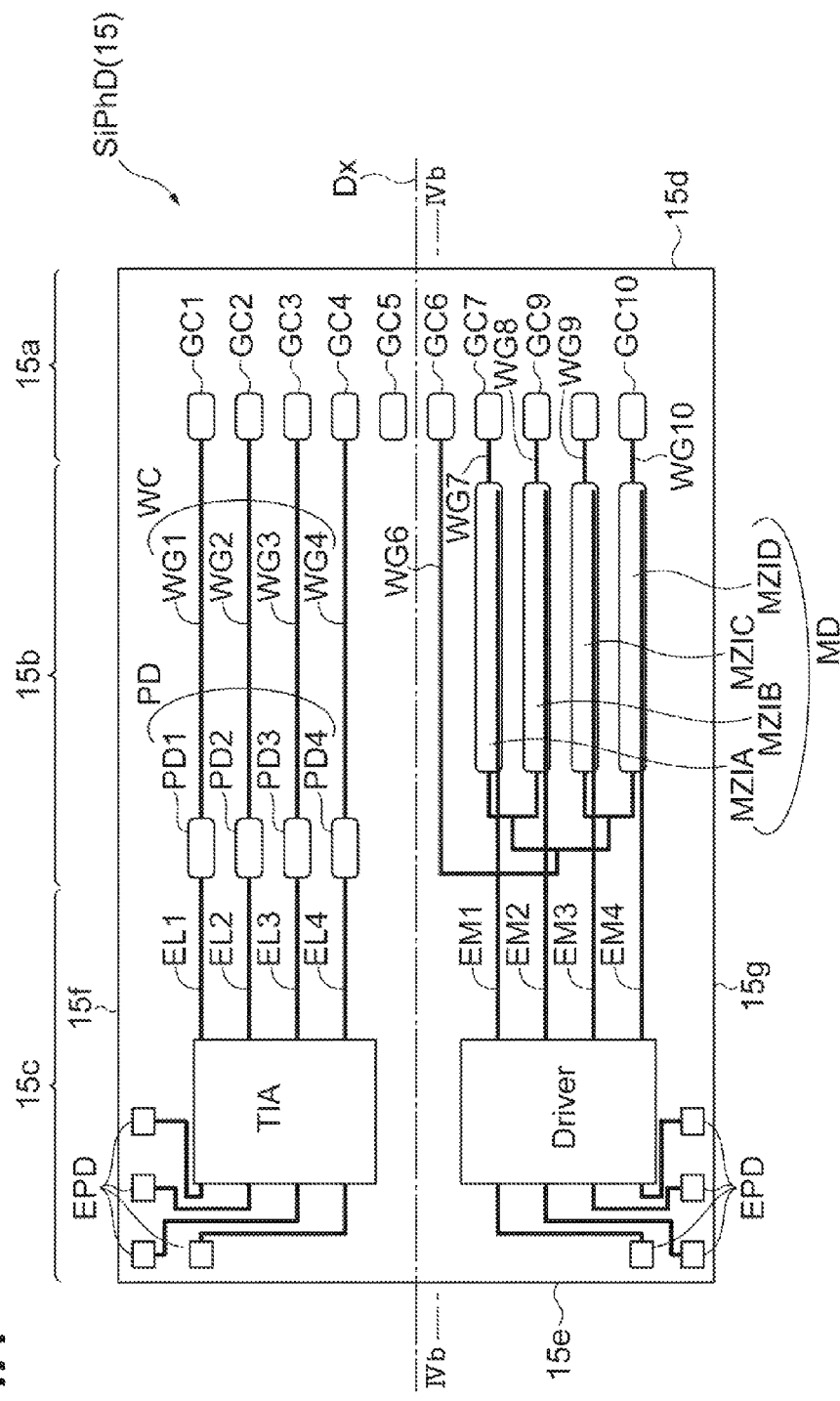
FIG. 4A is a plan view showing a silicon photonics semiconductor device.
FIG. 4B is a cross-sectional view, taken along the line IVb-IVb shown in FIG. 4A, showing the silicon photonics semiconductor device.

FIG. 1 is a schematic drawing showing an optical apparatus according to the present embodiment. FIG. 2 is a schematic drawing showing the optical apparatus connected to the optical part shown in the FIG. 1. FIG. 3 is a schematic drawing showing an optical apparatus fitted with a heat dissipating part. FIGS. 4A and 4B are schematic views each showing an exemplary semiconductor optical device for the optical apparatus according to the present embodiment. The optical apparatus 11 includes a printed circuit board 13, a semiconductor optical device 15 and a first electronic component 17. The printed circuit board 13 includes a main body (referred to as "body 19"), a first opening 13a and a second opening 13b which are provided in the body 19, and a metal piece 21 held by the body 19. The metal piece 21 has a first face 21a and a second face 21b, and the first surface 21a of the metal piece 21 is opposite to the second face 21b. The first opening 13a reaches the first face 21a of the metal piece 21, and the second opening 13b reaches the second face 21b of the metal piece 21. The printed circuit board 13 includes a plurality of wiring layers (L1, L2, L3, L4, L5L6, L7, L8) and a plurality of insulating layers (CR1, CR2, CR3, CR4, AD1H, AD2H, AD3H). The semiconductor optical device 15 is electrically connected to the printed circuit board 13. The semiconductor optical device 15 includes one or more optical couplers, and one or more optical elements which process light to/from the optical couplers, and an electrical circuit element(s) which processes electrical signals to/from the optical elements. The couplers, the optical elements and the circuit element are integrated to form the monolithic or hybrid semiconductor device. The first electronic component 17 is mounted on the printed circuit board 13, and is electrically connected to the semiconductor optical device 15 via a conductor of the printed circuit board 13. The semiconductor optical device 15 is mounted on the first face 21a of the metal piece 21 in the first opening 13a of the printed circuit board 13.

The optical apparatus 11 allows the first opening 13a, the metal piece 21 and the second opening 13b to be arranged in the direction of the first axis Ax1 such that the body 19 of the printed circuit board 13 to hold the metal piece 21. The printed circuit board 13 has wiring layers and insulating layers disposed to go round the first opening 13a and the second opening 13b, so that the printed circuit board 13 is provided with the metal piece 21, which can be used to mount the semiconductor optical device 15, with no significant change of the printed circuit board in thickness of the insulating layers and widths of the wiring layers, which may affect the electrical performance of the optical apparatus, in the body 19 of the printed circuit board 13. Further, the semiconductor optical device 15 is mounted on the first face 21a of the metal piece 21 in the first opening 13a of the printed circuit board 13 such that the entire back face of the semiconductor optical device 15 is supported by the second face 21b of the metal piece 21. The second opening 13b of the printed circuit board 13 extends to the second face 21b of the metal piece 21 to allow heat to dissipate through the second face 21b of the metal piece 21.

The body 19 of the printed circuit board 13 includes, in the present embodiment, a first dielectric core layer CR1, a second dielectric core layer CR2, a first insulating adhesive layer AD1H, a first metal layer L1, a second metal layer L2, a third metal layer L3, a fourth metal layer L4, another first dielectric core layer CR3, another second dielectric core layer CR4, another first insulating adhesive layer AD2H, another second insulating adhesive layer AD3H, another first metal layer L5, another second metal layer L6, another third metal layer L7, and another fourth metal layer L8. These dielectric core layers and insulating adhesive layers have respective dielectric constants and thicknesses which can provide the printed circuit board 13 with desired electrical characteristics. The first metal layer L1, the second metal layer L2, the third metal layer L3, the fourth metal layer L4, the other first metal layer L5, the other second metal layer L6, the other third metal layer L7, and the other fourth metal layer L8 have respective wiring widths which can provide the printed circuit board 13 with desired electrical characteristics. The first metal layer L1, the second metal layer L2, the third metal layer L3, the fourth metal layer L4, the other first metal layer L5, the other second metal layer L6, the other third metal layer L7, and the fourth metal layer L8 are disposed on respective dielectric core layers or insulating adhesive layers. Each of these metal layers has a pattern for the provision of common potential (e.g., ground) or electrical connection. In the present embodiment, the first metal layer L1 is provided on the top side 13c of the printed circuit board 13, and the other fourth metal layer L8 is provided on the rear side 13d of the printed circuit board 13. Specifically, the first metal layer L1 is provided on the first dielectric core layer; The first dielectric core layer CR1 is provided so as to separate the first metal layer L1 from the second metal layer L2; the second dielectric core layer CR2 is provided so as to separate the third metal layer L3 from the fourth metal layer L4; the first insulating adhesive layer AD1H is provided so as to separate the second metal layer L2 from the third metal layer L3; the fourth metal layer L4 is provided between the first dielectric core layer CR2 and the other first insulating adhesive layer AD2H, so that the other second insulating adhesive layer AD2H is bonded to the first dielectric core layer CR2 so as to isolate the fourth metal layer L4 from the metal piece 21; the other first metal layer L5 is provided between the other first dielectric core layer CR3 and the other first insulating adhesive layer AD2H, so that the other first insulating adhesive layer AD2H isolates the other first metal layer L5 from the metal piece 21; the other first dielectric core layer CR3 separates the other first metal layer L5 from the other second metal layer L6; the other second dielectric core layer CR4 separates the other metal layer L7 from the other fourth metal layer L8; the insulating adhesive layer AD3H separates the other second metal layer L6 from the other third metal layer L7; and the metal piece 21 are isolated from the first metal layer L1, the second metal layer L2, the third metal layer L3, the fourth metal layer L4, the other first metal layer L5, the other second metal layer L6, the third metal layer L7, and the other fourth metal layer L8.

The first dielectric core layer CR1, the second dielectric core layer CR2, the other first dielectric core layer CR3, the other dielectric core layer CR4 comprises, for example, a glass epoxy resin. The metal layer L1, the second metal layer L2, the third metal layer L3, the fourth metal layer L4, the other first metal layer L5, the other second metal layer L6, the other third metal layer L7, and the other fourth metal layer L8 comprises a metal foil, such as, a copper foil, a aluminum foil, and a magnesium foil. The first insulating adhesive layer AD1H, the other insulating adhesive layer AD2H, and the other insulating adhesive layer AD3H each includes, for example, prepreg, and the prepreg includes an insulating resin composition and a support of porous material, and the porous material is impregnated with the insulating resin composition. The insulating resin composition comprises, for example, a glass epoxy resin.

The material of the metal piece 21: copper, aluminum, magnesium, iron (including stainless steel), and anodized aluminum.

Range of thickness TM of the metal piece 21: 0.6 to 0.1 millimeters.

The depth D1 of the first opening 13a: 700 to 800 micrometers.
The depth D2 of the second opening 13b: 200 to 2200 micrometers.
The thickness DV1 of the printed circuit board: 2 to 3 millimeters.
The thickness of the semiconductor optical device 15: 700 to 1100 micrometers.
Distance DS between the side of the semiconductor optical device 15 and the top edge of the first opening 13a: 200 to 700 micrometers.

The metal piece 21 may have a form of a metal plate or a metal foil. The first opening 13a has first sides 13e extending in the direction of the first axis Ax1, the first sides 13e are made of insulating material, which includes epoxy resin of the dielectric core layers and prepreg of the insulating adhesive layers. The second opening 13b has first sides 13f extending in the direction of the first axis Ax1, the second sides 13f are made of insulating material, which includes, in particular, epoxy resin of the dielectric core layers and prepreg of the insulating adhesive layers. The first metal layers L1, the second metal layer L2, the third metal layer L3, and fourth metal layer L4 are separated from the first sides 13e of the first opening 13a, and the other first metal layer L5, the other second metal layer L6, the other third metal layer L7, and the other fourth metal layer L8 are separated from the second sides 13f of the second opening 13b. The separation can prevent the metal piece 21 from being in direct contact with the first metal layer L1, the second metal layer L2, the third metal layer L3, the fourth metal layer L4, the other first metal layer L5, the other second metal layer L6, the other third metal layer L7, and the other fourth metal layer L8. Any metal layer in the body 19 is separated from the first sides 13e and the second sides 13f by a distance of 150 micrometers or more.

The metal piece 21 includes a first portion 21c and a second portion 21d. The first portion 21c surrounds the second portion 21d to have a strip-shaped region, which may encircle the second portion 21d. The other first insulating adhesive layer AD2H and the other first dielectric core layer CR2 firmly grasp the periphery of the metal piece 21, in particular, the first portion 21c, so that the body 19 holds the metal piece 21. The width of the strip-shaped region may be, for example, 100 to 500 micrometers. For ease of understanding, FIGS. 1 to 3 show the printed circuit board 13 including the first opening 13a and the second opening 13b that have the same size in the cross-sectional shape thereof, and the present embodiment is not limited thereto. Specifically, the bottom edge of the first opening 13a on the first face 21a of the metal piece 21 may be outside the bottom edge of the second opening 13b on the second face 21b of the metal piece 21. Alternatively, the bottom edge of the first opening 13a on the first face 21a of the metal piece 21 can be located inside the bottom edge of the second opening 13b on the second face 21b of the metal piece 21.

The body 19 of the printed circuit board 13 includes a first laminate structure 19a and a second laminate structure 19b. The first laminate structure 19a is provided with the first opening 13a, and the second laminate structure 19b is provided with the second opening 13b. The first laminate structure 19a, the metal piece 21 and the second laminate structure 19b are arranged in the direction of the first axis Ax1, such that the first laminate structure 19a and the second laminate structure 19b clamp the periphery of the metal piece 21 (e.g., the first portion 21c) to hold the metal piece 21. In the present embodiment, the first laminate structure 19a is provided with the first dielectric core layer CR1, the second dielectric core layer CR2, the first insulating adhesive layer AD1H, the first metal layer L1, the second metal layer L2, the third metal layer L3, and the fourth metal layer L4, and the second laminate structure 19b is provided with the first dielectric core layer CR3, the second dielectric core layer CR4, the first insulating adhesive layer AD2H, the second insulation adhesive layer AD3H, the first metal layer L5, the second metal layer L6, the third metal layer L7, and the fourth metal layer L8. The optical apparatus 11 includes the arrangement of the first laminate structure 19a, the metal piece 21 and the second laminate structure 19b in the direction of the first axis Ax1, such that the first laminate structure 19a and the second laminate structure 19b holds the metal piece 21. The first laminate structure 19a and the second laminate structure 19b in the printed circuit board 13 have respective internal structures, such as the width of wiring layers and the thickness of insulating layers, which may affect the electrical characteristics of the printed circuit board, and the wiring layers and the insulating layers of the first laminate structure 19a and the second laminate structure 19b are disposed to circumvent the first opening 13a and the second opening 13b, respectively, so that the printed circuit board 13 incorporates the metal piece 21 which can be used to mount a semiconductor device.

In order to provide the body 19 of the printed circuit board 13 with desired uniformity and flatness, the dielectric core layers and the insulating adhesive layers have thicknesses of not more than respective upper limits. The upper limits relate to the width of the metal layers in the printed circuit board. The limits for glass-epoxy resin used in the inventors' study are as follows: the thickness of the dielectric core layers is in the range of 60 to 1600 micrometers; and the thickness of the insulating adhesive layers is in the range of 30 to 200 micrometers. In order to obtain a desired thickness thereof, two or more dielectric core layers may be laminated, and two or more insulating adhesive layers may be laminated; and one or more dielectric core layers and one or more insulating adhesive layers may be combined to form a laminate. The glass-epoxy resin layers that are disposed between the uppermost and lowermost metal layers and respective underlying metal layers have a thickness of 150 micrometers, and glass-epoxy resin layers between the above underlying metal layers may have a thickness of not more than 400 micrometers.

The depth D1 of the first opening 13a and the depth D2 of the second opening 13b can be changed depending upon the thicknesses of the dielectric core layers and the insulating adhesive layers.

Example 1

Metal layer (L1): 100 micrometers.
Dielectric core layer (CR1): 150 micrometers.
Metal layer (L2): 30 micrometers.
Insulating adhesive layer (AD1H): 400 micrometers.
Metal layer (L3): 20 μm.
Dielectric core layer (CR2): 200 micrometers.
Metal layer (L4): 40 micrometers.
Metal piece 21: 200 micrometers.
Insulating adhesive layer (AD2H): 200 micrometers.
Metal layer (L5): 40 micrometers.
Dielectric core layer (CR3): 200 micrometers.
Metal layer (L6): 20 micrometers.
Insulating adhesive layer (AD3H): 400 micrometers.
Metal layer (L7): 30 micrometers.
Dielectric core layer (CR4): 150 micrometers.
Metal layer (L8): 100 micrometers.

The depth of the first opening 13a: about 740 micrometers.
The depth of the second opening 13b: about 940 micrometers.

Example 2

Metal layer (L1): 100 micrometers.
Dielectric core layer (CR1): 150 micrometers.
Metal layer (L2): 30 micrometers.
Insulating adhesive layer (AD1H): 400 micrometers.
Metal layer (L3): 20 micrometers.
Dielectric core layer (CR2): 400 micrometers.
Metal layer (L4): 40 micrometers.
Metal piece 21: 400 micrometers.
Insulating adhesive layer (AD2H): 400 micrometers.
Metal layer (L5): 40 micrometers.
Dielectric core layer (CR3): 100 micrometers.
Metal layer (L6): 20 micrometers.
Insulating adhesive layer (AD3H): 100 micrometers.
Metal layer (L7): 30 micrometers.
Dielectric core layer (CR4): 150 micrometers.
Metal layer (L8): 100 micrometers.
The depth of the first opening 13a: about 740 micrometers.
The depth of the second opening 13b: about 540 micrometers.

Example 3

Metal layer (L1): 100 micrometers.
Dielectric core layer (CR1): 150 micrometers.
Metal layer (L2): 30 micrometers.
Insulating adhesive layer (AD3H): 200 micrometers.
Metal layer (L3): 20 micrometers.
Dielectric core layer (CR2): 150 micrometers.
Metal layer (L4): 40 micrometers.
Insulating adhesive layer (AD3H): 400 micrometers.
Metal layer (L5): 40 micrometers.
Dielectric core layer (CR3): 200 micrometers.
Metal layer (L6): 20 micrometers.
Metal piece 21: 600 micrometers.
Insulating adhesive layer (AD3H): 600 micrometers.
Metal layer (L7): 30 micrometers.
Dielectric core layer (CR4): 150 micrometers.
Metal layer (L8): 100 micrometers.
The depth of the first opening 13a: about 750 micrometers.
The depth of the second opening 13b: about 280 micrometers.

The optical apparatus 11 may further include an optical part 25 as shown in FIG. 2, and the optical part 25 includes a plurality of optical waveguides 25a, such as optical fibers, and a holder 25b for holding the optical waveguides 25a. The optical part 25 may include, for example, a pigtail-type optical connector or a fiber stub. The optical apparatus 11 allows the semiconductor optical device 15 to support the optical part 25 such that the optical part 25 is optically coupled to the optical couplers of the semiconductor optical device 15.

The body 19 includes a plurality of pad electrodes 23a, 23b, 23c, 23d, 23e, 23f, 23g, 23h, 23i, and 23j arranged along the edge of the first opening 13a, which contains the semiconductor optical device therein, on the front face (13c) of the body 19, and the plurality of pad electrodes (23a to 23j) allows electrical connection. Specifically, the printed circuit board 13 can provide the first laminate structure 19a of the body 19 with the plurality of pad electrodes (23a to 23j), which are arranged around the first opening 13a on the front face (13c), and each of the pad electrodes (23a to 23j) is connected to the semiconductor optical device 15, mounted on the first face 21a of the metal piece 21 in the first opening 13a, via a connecting conductor, such as a bonding wire. The second opening 13b extends from the back face (13d) of the second laminate structure 19b of the body 19 to the second face 21b of the metal piece 21, so that the second face 21b of the metal piece 21 allows the dissipation of heat generated by the semiconductor optical device 15 on the first face 21a of the metal piece 21.

For example, the depth D1 of the first opening 13a may be smaller than the thickness DV1 of the semiconductor optical device 15. The semiconductor optical device 15 is disposed on the first face 21a of the metal piece 21 in the first opening 13a, so that the optical apparatus 11 has a structure in which the top face of the semiconductor optical device 15 is made higher than the front face (13c) of the body 19 (the first laminate structure 19a). This structure makes it easy to electrically connect the printed circuit board 13 to the semiconductor optical device 15. The structure also makes it easy to connect the optical part 25 with the semiconductor optical device 15. Further, in die-bonding the semiconductor optical device 15 in the first opening 13a of the printed circuit board 13 with an adhesive agent, the structure prevents an adhesive agent, accidentally overflowing out of a gap formed between the sides of the semiconductor optical device 15 and the first opening 13a of the printed circuit board 13, from overhanging the top face of the semiconductor optical device 15. In the present embodiment, the printed circuit board 13 comprises the single first opening 13a, and may be provided with one or more additional first openings like the first opening 13a.

Specifically, the optical apparatus 11 may include one or more first electronic components 17 (17a, 17b, 17c, 17d, 17e) mounted on the front face 13c of the printed circuit board 13 (the surface of the first laminate structure 19a). The optical apparatus 11 may further include second electronic component 27 (27a, 27b) mounted on the rear face 13d of the printed circuit board 13 (the surface of the second laminate structure 19b). The first electronic components 17 and the second electronic component 27 are electrically connected to the semiconductor optical device 15 on the printed circuit board 13 directly or via an electronic component(s). The printed circuit board 13 including a multi-layer wiring substrate allows the mounting of electrical components on not only the first face 13c of the printed circuit board 13 (the surface of the first laminate structure 19a) but also the rear face 13d of the printed circuit board 13 (the surface of the second laminate structure 19b).

The optical apparatus 11 may further comprise a heat dissipation part 29 as shown in FIG. 3, and the heat dissipating part 29 includes a supporting face 29a for supporting the second face 21b of the metal piece 21 in the second opening 13b of the body 19. The metal piece 21 of the printed circuit board 13 is supported by the heat dissipating part 29 on the second face 21b thereof, and mounts the semiconductor optical device 15 on the first face 21a thereof.

The semiconductor optical device 15 may include one or more photodiodes and/or one or more Mach-Zehnder modulators acting as the optical element, and an electrical circuit element(s) which processes an electrical signal associated with the optical element. The optical element and the circuit element generate heat during operation. This heat can be released through the second face 21b of the metal piece 21 of the printed circuit board 13 in the second opening 13b of the body 19 reaching the second face 21b of the metal piece 21. Specifically, the semiconductor optical device 15 may include a silicon photonics semiconductor device, and the silicon photonics semiconductor device can perform the processing of optical signals and the processing of electrical signals.

FIGS. 4A and 4B show an exemplary silicon photonics semiconductor device for the optical apparatus according to the present embodiment. FIG. 4A is a plan view showing the silicon photonics semiconductor device, and FIG. 4B is a cross-sectional view, taken along the line IVb-IVb shown in FIG. 4A, showing the silicon photonics semiconductor device. Referring to FIG. 4A, the silicon photonics semiconductor device SiPhD includes an optical coupler, such as grating couplers GC1, GC2, GC3, GC4, GC5, GC6, GC7, GC8, CG9, CG10 (e.g. the number of the couplers is 10), each of which acts as an optical coupler.

The grating couplers GC1 to CG4 are used for an optical receiver. Optical signals from the grating couplers GC1 to CG4 are supplied to a light-receiving element PD through an optical circuit WC. In the present embodiment, the optical circuit WC includes optical waveguides WG1 to WG4. The grating couplers GC1 to CG4 are optically coupled to photodiodes PD1 to PD4 through the optical waveguides WG1 to WG4, respectively. The photodiodes PD1 to PD4 are connected to the electrical circuit TIA (e.g. transimpedance amplifier) through conductive lines EL1 to EL4. The electrical circuit TIA performs the processing (such as, a current-voltage conversion, and amplification) of electrical signals (e.g. photocurrent) from the photodiodes PD1 to PD to generate electrical signals corresponding to the received optical signals.

Further, the grating couplers GC6 to CG10 are used for an optical transmitter. In the present embodiment, a laser beam from the grating coupler GC6 is supplied to optical modulators MD. The optical modulator MD includes, for example, Mach-Zehnder modulators MZIA, MZIB, MZIC, and MZID. The Mach-Zehnder modulators MZIA to MZID receive electrical signals EM1 to EM4 from a drive circuit Driver to generate modulated light beams in response to an the electrical signal EM1 to EM4, respectively. These modulated light beams propagate to the grating couplers GC7 to CG10 through the optical waveguides WG7 to WG10, respectively.

The silicon photonics semiconductor device SiPhD includes a first portion 15a, a second portion 15b and the third portion 15c, which are arranged in the direction of the device axis Dx. The first portion 15a is provided with an arrangement of the grating couplers GC1 to CG10. The grating couplers GC1 to CG10 are arranged along an edge 15d in the first portion 15a. Another side 15e opposite to the side 15d is in the third portion 15c. One end of the edge 15d and another side 15e are connected with the other ends thereof by a first side 15f and a second side 15g, respectively, and the first side 15f and the second side 15g extend in the direction of the second axis Ax2, and the side 15d and the other side 15e extend in a direction intersecting with the second axis Ax2. The second portion 15b is provided with the optical element, such as a semiconductor light receiving element and an optical modulator. The third portion 15c is provided with the electric circuits, such as the electric circuit TIA and the drive circuit Driver, and the pad electrodes EPD for electrical circuits. The pad electrodes EPD are arranged in the other side 15e in the third part 15c of the silicon photonics semiconductor device SiPhD, and if necessary, can be arranged on the first side 15f and/or the second side 15g. Alternatively, the pad electrodes EPD are arranged along the first side 15f and/or the second side 15g in the portion 15c of the silicon photonics semiconductor device SiPhD, and if necessary, may be arranged in the other side 15e.

With reference to FIGS. 5 to 12, major steps in a method for producing the optical apparatus 11 will be illustrated. FIGS. 5 to 12 are views each showing a major step in the method for producing a printed circuit board 13 and the method for producing the optical apparatus 11. In order to avoid complexity, a description will be given with reference to the drawings which depict a single section for a single printed circuit board to be produced in the method for producing the optical apparatus 11. If possible, the reference symbols in FIGS. 1-3 will be also used in the subsequent description.

In a preparation step, a printed circuit board 13 is prepared as below. In the present embodiment, the printed circuit board 13 is produced in order to prepare the optical apparatus 11.

Figure 5:
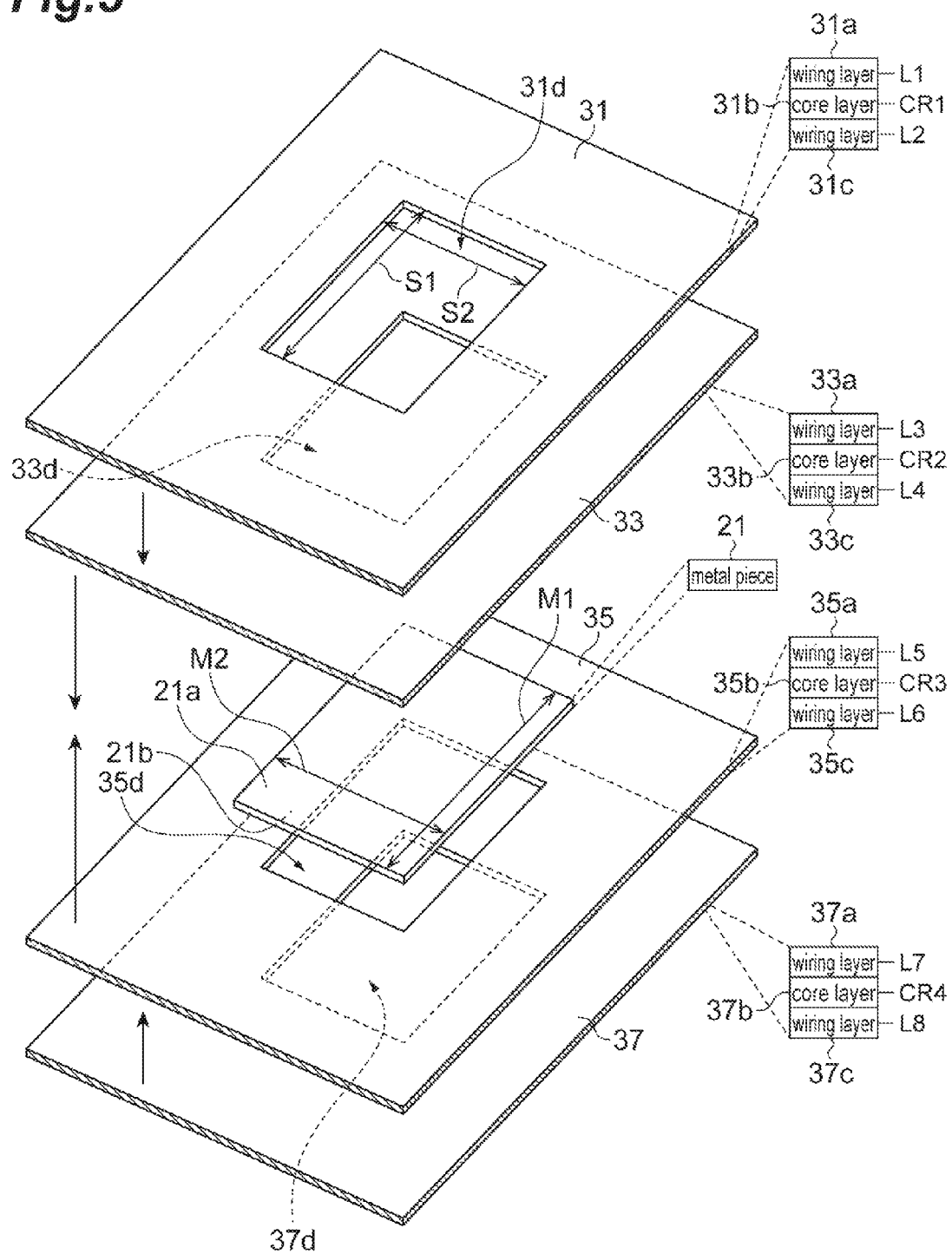
FIG. 5 is a schematic view showing a major step in a method for producing an optical apparatus according to the present embodiment.

In the method for fabricating the printed circuit board 13, the metal piece 21, and parts for laminate bodies each having a desired number of layers are prepared. As shown in FIG. 5, in the present embodiment, the metal piece 21, a first laminate body 31, a second laminate body 33, another first laminate body 35 and another second laminate body 37 are prepared. The first laminate body 31 includes a first metal layer 31a for wiring or grounding, a first dielectric core layer 31b, and a second metal layer 31c for wiring or grounding. The first metal layer 31a is disposed on the one side of the first dielectric core layer 31b, and the second metal layer 31c is disposed on the other side of the first dielectric core layer 31b. The second laminate body 33 includes the third metal layer 33a for wiring or grounding, the second dielectric core layer 33b and the fourth metal layer 33c for wiring or grounding. The third metal layer 33a is disposed on one side of the second dielectric core layer 33b, and the fourth metal layer 33c is disposed on the other side of the second dielectric core layer 33b. The other first laminate body 35 includes the other first metal layer 35a for wiring or grounding, the other first dielectric core layer 35b, and the other second metal layer 35c for wiring or grounding. The other first metal layer 35a is disposed on one side of the other second dielectric core layer 35b, and the other second metal layer 35c is disposed on the other side of the other first dielectric core layer 35b. The other second laminate body 37 includes the other third metal layer 37a for wiring or grounding, the other second dielectric core layer 37b, and the other fourth metal layer 37c for wiring or grounding. The other third metal layer 37a is disposed on one side of the other second dielectric core layer 37b, and the other fourth metal layer 37c is disposed on the other side of the other second dielectric core layer 37b.

The first laminate body 31, the second laminate body 33, the other first laminate body 35 and the other second laminate body 37 have a first opening 31d, a second opening 33d, the another first opening 35d, and another second opening 37d, respectively. The first opening 31d has the same size as the second openings 33d, and the second opening 35d has the same size as the other second opening 37d. In the present embodiment, the first opening 31d, the second opening 33d, the other first opening 35d and the other second opening 37d have the same size, and the first opening 31d, the second opening 33d, the other first openings 35d and the other second opening 37d may have a shape of, for example, square or rectangular. These openings have a length in the first direction (e.g., longitudinal direction), which is referred to as "S1", and another length in the second direction perpendicular to the first direction (e.g., traverse direction), which is referred to as "S2". In the present embodiment, the metal piece 21 may have a shape of for example, square or rectangular. The metal piece 21 has a length in the first direction of the size (e.g., longitudinal direction), which is referred to as the "M1," and another length of the metal piece 21 in the second direction perpendicular to the first direction (e.g. traverse direction), which is referred to as "M2". These lengths meet the following magnitude relationship: M1>S1 and M2>S2. Further, the metal layers in each of the laminate bodies are separated from the sides of the opening therein, and the separation distance may be, for example, 200 micrometers or more. This separation can prevent the metal layers in the individual laminate bodies from coming into contact with the metal piece 21 in the subsequent pressing step accidentally.

The first metal layer 31a and the second metal layer 31c in the first laminate body 31 have respective patterns to provide electrical connections required in the printed circuit board to be formed. Further, the first dielectric core layer 31b includes one or more through-holes in addition to the first opening 31d, and the through-holes pass through the first dielectric core layer 31b and connect the metal layer 31a and the second 12 metal layers 31c with each other. The through-holes are arranged so as to make electrical connections required in the printed circuit board to be formed. The second laminate body 33 also has the same structure as the first laminate body 31, except for the specific pattern and arrangement.

The first metal layer 35a and the second metal layer 35c in the first laminate body 35 have respective patterns to provide electrical connections required in the printed circuit board to be formed. The first dielectric core layer 35b also has second through holes, which pass through the first dielectric core layer 35b, in addition to the first opening 35d. The second through holes connect the first metal layer 35a and the second metal layer 35c with each other, and the second through-holes are arranged so as to provide electrical connections required in the printed circuit board to be formed. The second laminate body 37 may have the same structure as the first laminate body 35, except for the specific pattern and arrangement.

Figure 6:
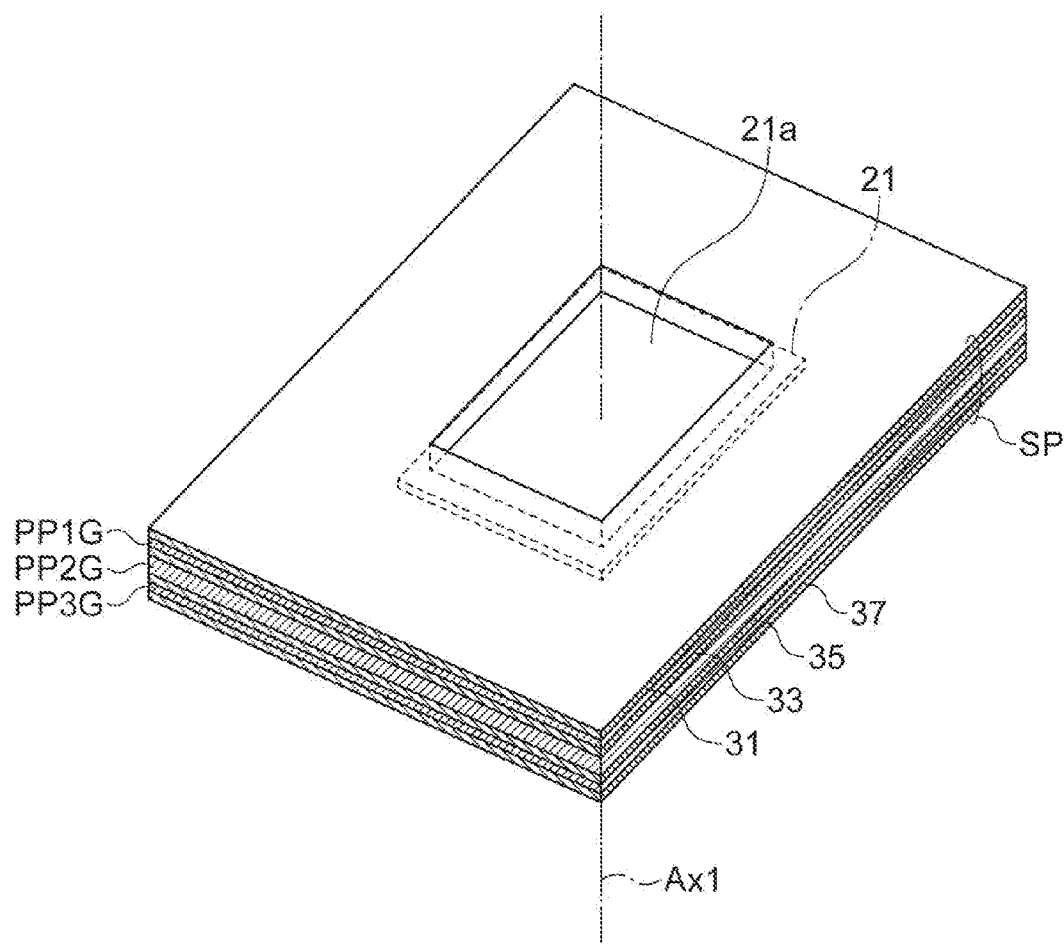
FIG. 6 is a schematic view showing a major step in the method according to the present embodiment.

With reference to FIG. 6, an arranging step is shown. The laminate body 31, the second laminate body 33, the metal piece 21, the first laminate body 35 and the second laminate body 37 are arranged in order in the direction of the first axis such that the metal piece 21 is located between the first and second laminate bodies 31 and 33 and the first and second laminate bodies 35 and 37, thereby forming a product SP including the first laminate body 31, the second laminate body 33, the metal piece 21, and the first laminate body 35 and the second laminate body 37. A first resin adhesive layer PP1G, a second resin adhesive layer PP2G, and a third resin adhesive layer PP3G are disposed between the corresponding two laminate bodies among the above laminate bodies. These resin adhesive layers may include, for example, a prepreg, and the prepreg includes insulating resin composition and a support of porous material, and the porous material is impregnated with the insulating resin composition. The resin adhesive layer is away from the sides of the respective openings that the first laminate body 31, the second laminate body 33, the metal piece 21, the first laminate body 35 and the second laminate body 37 have, and the separation distance may be, for example, 200 micrometers or more. This separation can prevent the insulating resin compositions from transuding to the openings in subsequent pressing step. In the product SP, the first opening 31d of the first laminate body 31 and the second opening 33d of the first laminate body 33 communicate with each other to constitute the first opening 13a, and the first opening 13a extends in the direction of the first axis Ax1 to the first face 21a of the metal piece 21. The first opening 35d of the first laminate body 35 and the second opening 37d of the second laminate body 37 communicate with each other to constitute the second opening 13b, and the second opening 13b extends in the direction of the first axis Ax1 to the second face 21b of the metal piece 21.

Figure 7A:
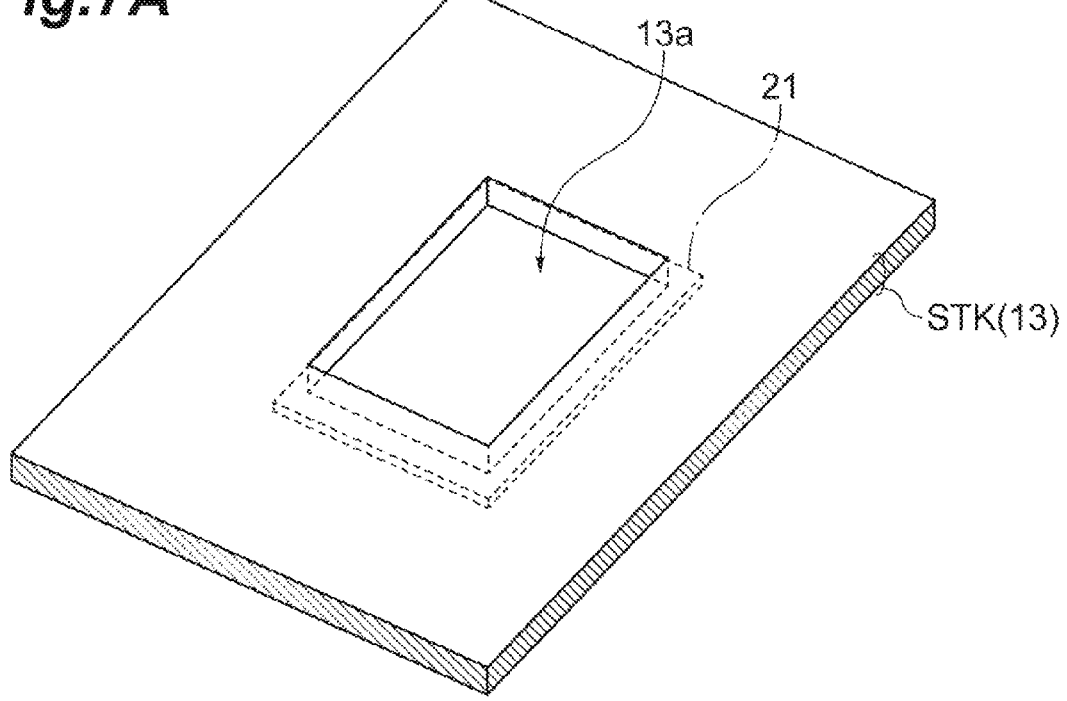
FIGS. 7A and 7B are schematic views each showing a major step in the method according to the present embodiment.
Figure 7B:
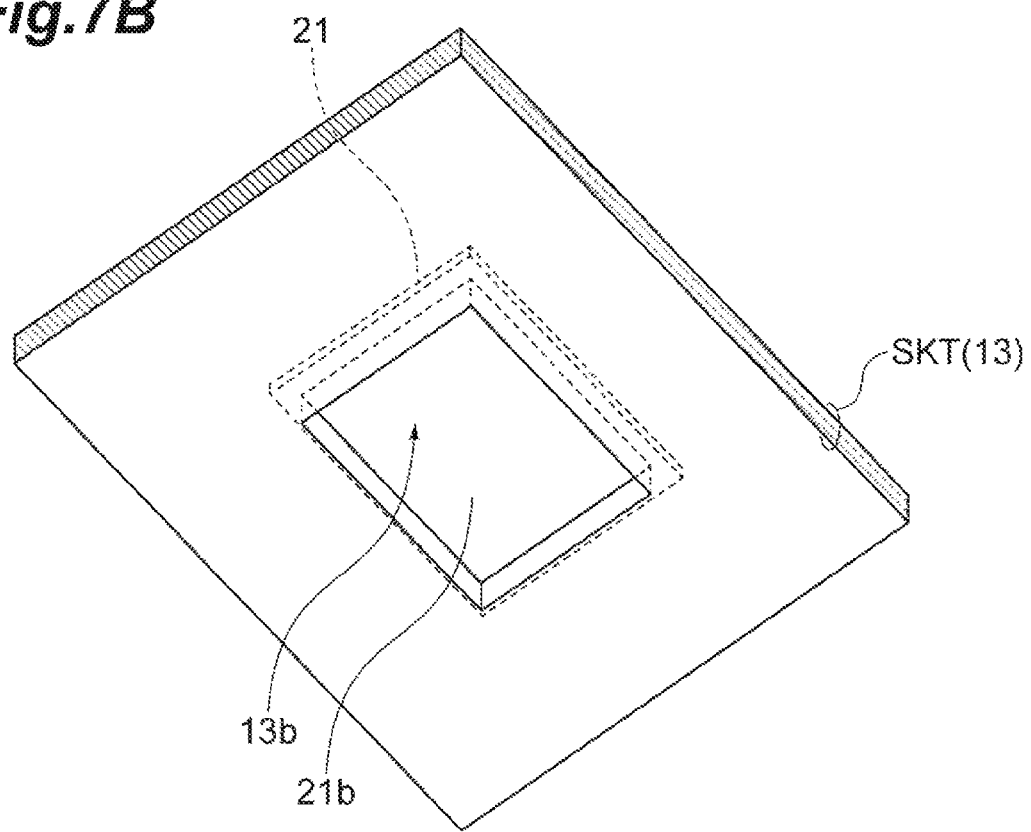

With reference to FIGS. 7A and 7B, a pressing step will be illustrated. The product SP is pressed such that the first and second laminate bodies 31 and 33 and the first and second laminate bodies 35 and 37 hold the outer portion of the metal piece 21. The pressing allows the first laminate body 31, the first resin adhesive layer PP1G, the second laminate body 33, the second resin adhesive layer PP2G, the first laminate body 35, the third resin adhesive layer PP3G and the second laminate body 37 to form an integrated product, thereby providing a stack STK for the printed circuit board 13. The pressing step provides a virtual product for the printed circuit board 13. In the laminate STK, the openings of the first and second laminate bodies 31 and 33 together constitute the first opening 13a, and the openings of the first and second laminate bodies 35 and 37 together constitute the second opening 13b. The pressing solidify the first resin adhesive layer PP1G, the second resin adhesive layer PP2G, and the third resin adhesive layer PP3G to form the respective insulating resin layers, and the insulating resin layers are integrated with the first laminate body 31, the second laminate body 33, the first laminate body 35 and the second laminate body 37 to form a laminate. The laminate firmly holds the outer portion of the metal piece 21.

The above fabricating method produces a product SP. In the product SP, the first laminate body 31, the second laminate body 33, the metal pieces 21, the first laminate body 35 and the second laminate body 37 are arranged in the direction of the first axis Ax1, and the metal piece 21 is disposed between the first and second laminate bodies 31 and 33 and the first and second laminate bodies 35 and 37 and are held thereby. In the product SP, the first opening 31d of the first laminate body 31 and the second the opening 33d of the second laminate body 33 are aligned with the metal piece 21 in a row, and the first opening 35d of the first laminate body 35 and the second opening 37d of the second laminate body 37 are also aligned with the metal piece 21 in a row. One of the first opening 13a and the second opening 13b, which reach the first face 21a and second face 21b of the metal piece 21 respectively, can be used for mounting a semiconductor device, and the other of the first opening 13a and the second opening 13b can be used for heat dissipation with the heat dissipating part 29. In the present printed circuit board 13, the metal piece 21 held by the first laminate structure 19a and the second laminate structure 19b can support the semiconductor device and serves as a heat dissipation path of heat generated by the semiconductor device. This path does not go through any insulating region of the printed circuit board 13.

Figure 8:
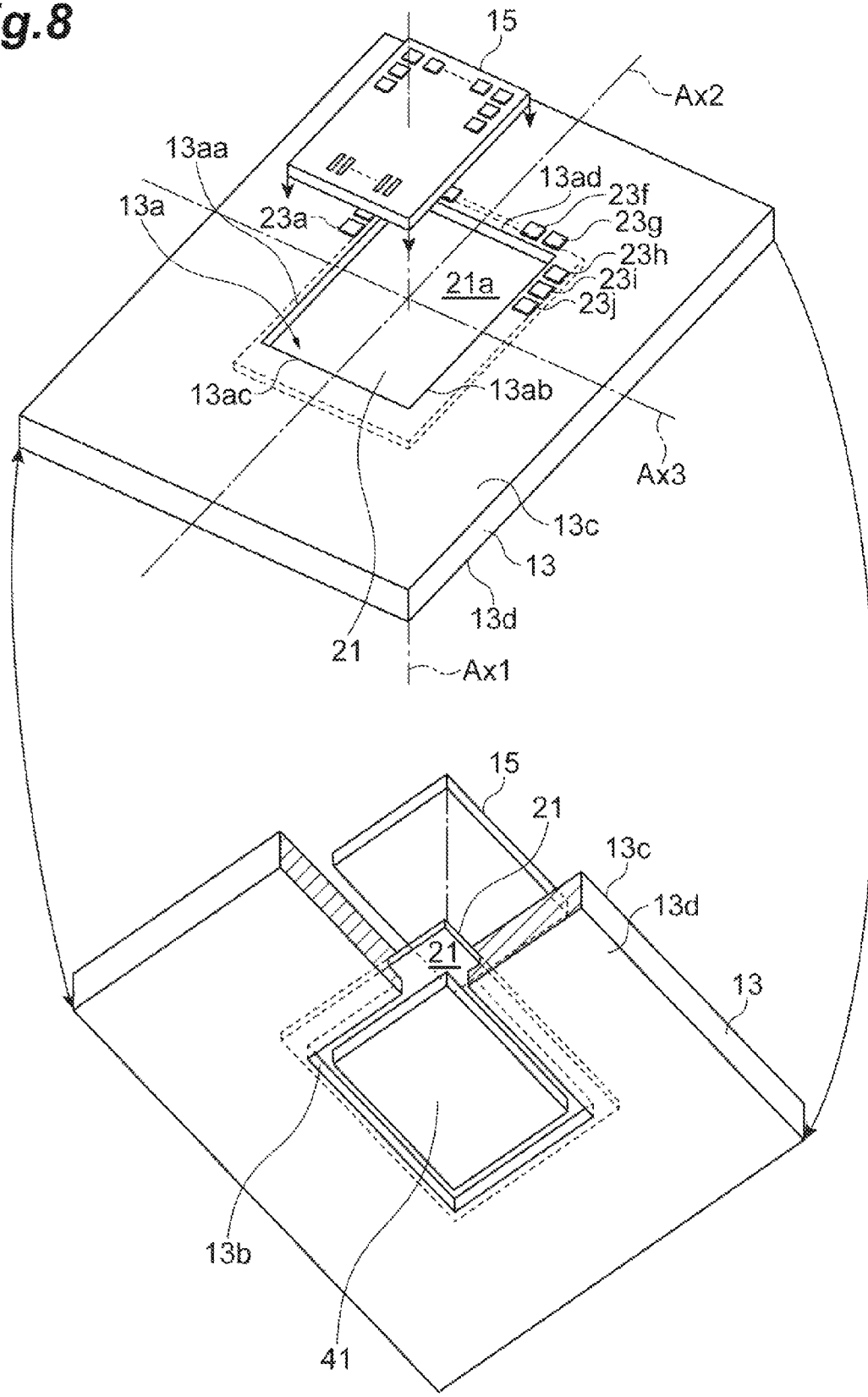
FIG. 8 is a schematic view showing a major step in the method according to the present embodiment.

The above processes complete the preparation of the printed circuit board 13. The printed circuit board 13, as shown in FIG. 8, is provided with the first laminate structure 19a, the second laminate structure 19b, and the metal piece 21 held by the first laminate structure 19a and the second laminate structure 19b. The first opening 13a and the second opening 13b have respective shapes each of which is substantially four sides on the surface of the corresponding laminate structure, for example, a quadrilateral, such as a rectangle or square. Each quadrilateral has a first side 13aa and a second side 13*ab*, which extend in the direction of the second axis Ax2 intersecting with the direction of the first axis Ax1, and a third side 13*ac* and a fourth side 13*ad* extending in the direction of the three axes Ax3 intersecting with the directions of the first axis Ax1 and the second axis Ax2.

In the mounting process, as shown in FIG. 8, the semiconductor optical device 15 is oriented in the direction of the second axis Ax2 (the device axis Dx shown in FIGS. 4A and 4B) and aligned with the printed circuit board 13, and the semiconductor optical device 15 thus aligned is die-bonded onto the metal piece 21 in the first opening 13*a* of the printed circuit board 13. In order to oppose the pressing force in the die bonding, the metal piece 21 is supported by a supporting jig 41 in the second opening 13*b* of the printed circuit board 13 to avoid damage to the metal piece 21. The semiconductor optical device 15 is bonded to the metal piece 21 by an adhesive material 45, such as silicone grease, and silver paste.

Figure 9:
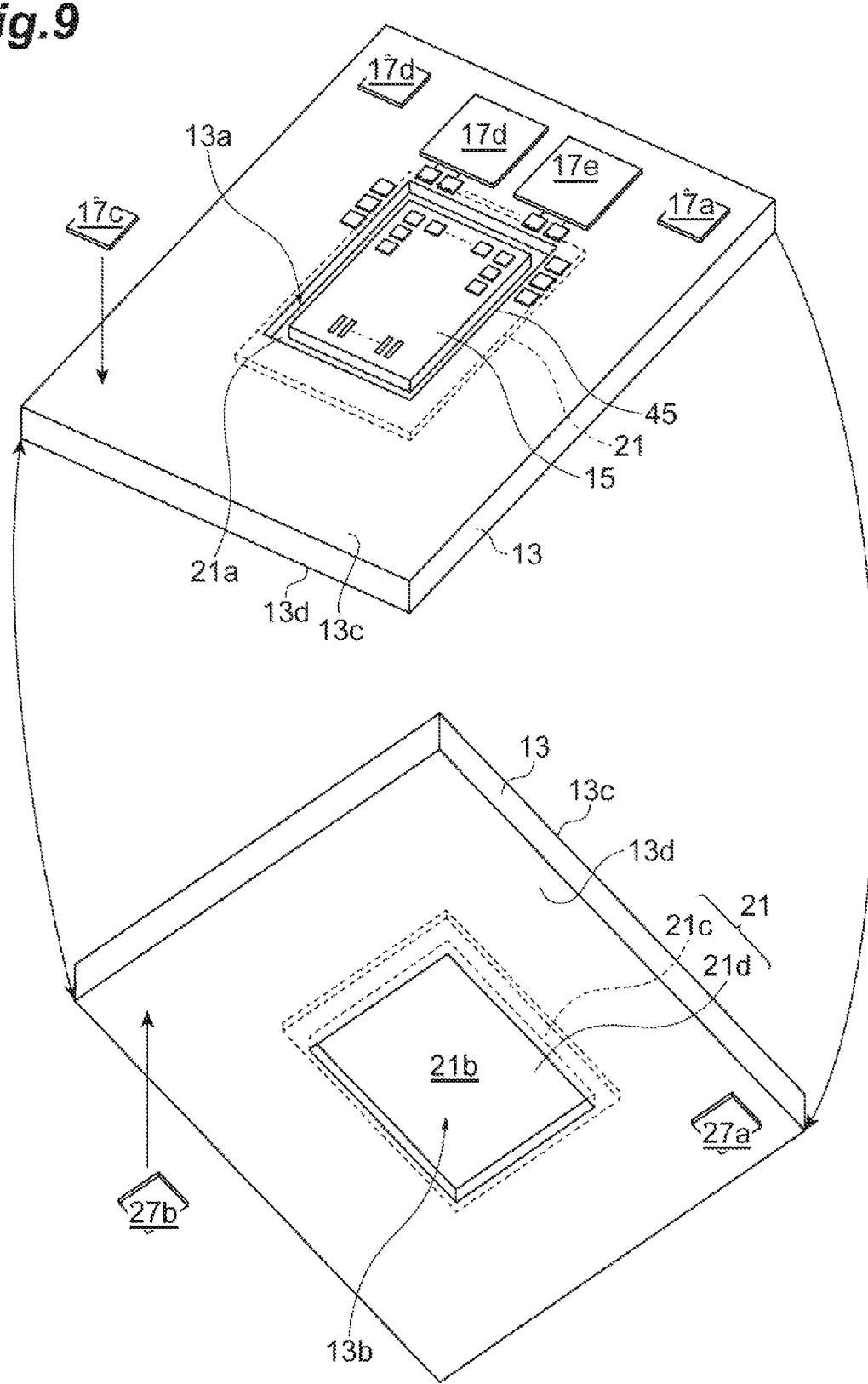
FIG. 9 is a schematic view showing a major step in the method according to the present embodiment.

Further, as shown in FIG. 9, the first electronic component 17 is mounted on the front face 13*c* of the printed circuit board 13, and the second electronic component 27 is mounted on the back face 13*d* of the printed circuit board 13.

Figure 10:
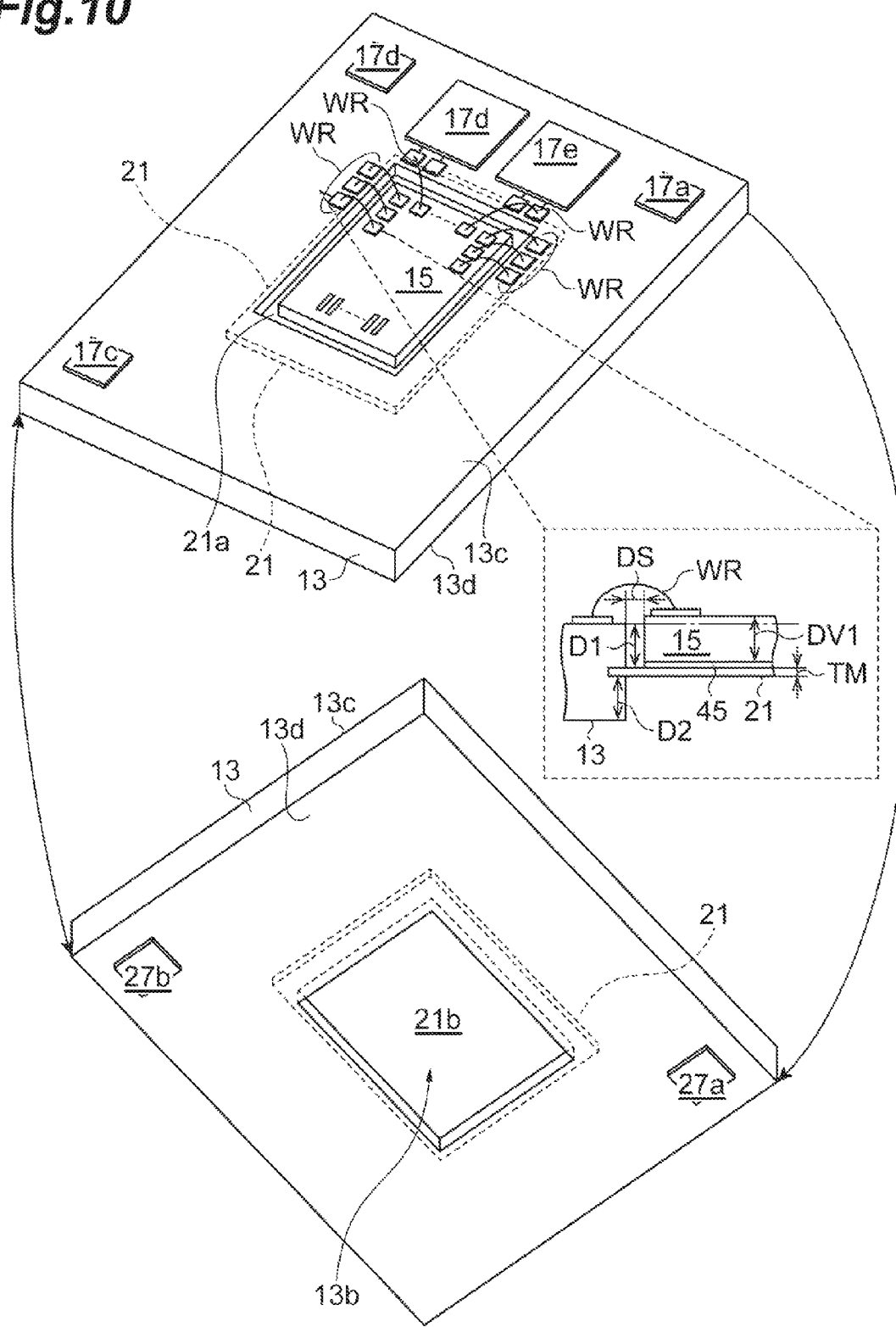
FIG. 10 is a schematic view showing a major step in the method according to the present embodiment.

In the electrical connecting step, as shown in FIG. 10, the pad electrodes EPD of the semiconductor optical device 15 thus mounted are connected to conductors, for example, pad electrodes 23*a* to 23*j*, on the mounting face of the printed circuit board 13 by conductive lines, such as a bonding wire WR, to make electrical connection.

The first opening 13*a* and the second opening 13*b* of the printed circuit board 13 reach the first face 21*a* and the second face 21*b* of the metal piece 21, respectively. The first face 21*a* is exposed at the first opening 13*a*, and can be used for mounting a semiconductor device, and the second face 21*b* opposite to the first face 21*a* can be used for heat dissipation through the heat dissipating part 29, which is mounted in the second opening 13*b* in a later step, to provide the semiconductor optical device 15 with a major heat dissipation path. The major heat dissipation path does not go through any insulating region of the printed circuit board 13. The metal piece 21 held by the first laminate structure 19*a* and the second laminate structure 19*b* supports the semiconductor device in the recess provided by the first opening 13*a*. Mounting the semiconductor device in the recess can lower the maximum height of a bonding wire WR connecting the semiconductor optical device 15 with a conductor of the printed circuit board 13. In order to avoid increase in the length of the bonding wire WR, the distance DS between the side of the semiconductor optical device 15 and the side of the first opening 13*a* may be 100 micrometers or less.

Figure 11:
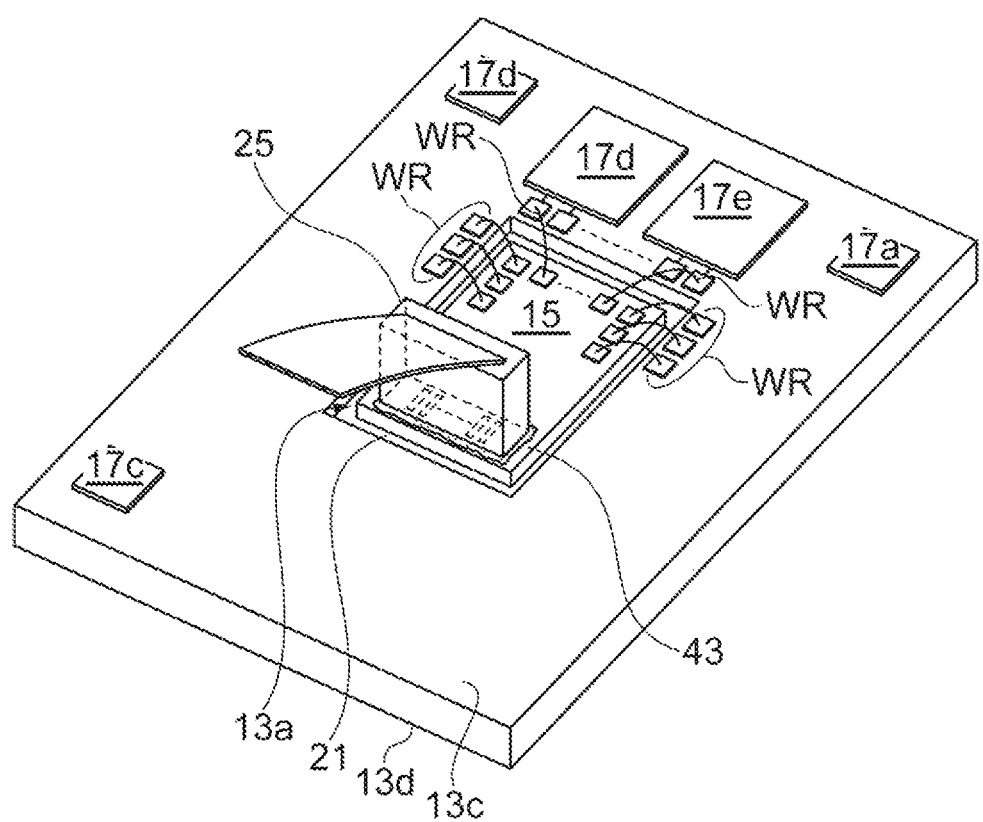
FIG. 11 is a schematic view showing a major step in the method according to the present embodiment.

In the connection process of the optical part, as illustrated in FIG. 11, the optical part 25 is prepared. The optical part 25 is optically connected with the optical couplers of the semiconductor optical device 15 mounted on the printed circuit board 13. The optical part 25 encompasses a stub, an optical connector, or both. In order to fix the optical part 25 on the upper face of the semiconductor optical device 15, an adhesive member 43 can be used. In connecting the optical part 25 with the optical apparatus, the semiconductor optical device 15 mounted in the recess can reduce the occurrence of accidental contact between the bonding wire WR and the optical part 25. Further, the top of the semiconductor optical device 15 is made slightly higher with respect to the front face 13*c* of the printed circuit board 13, allowing the optical part 25 to be easily attached to the front face of the semiconductor optical device 15

Figure 12:
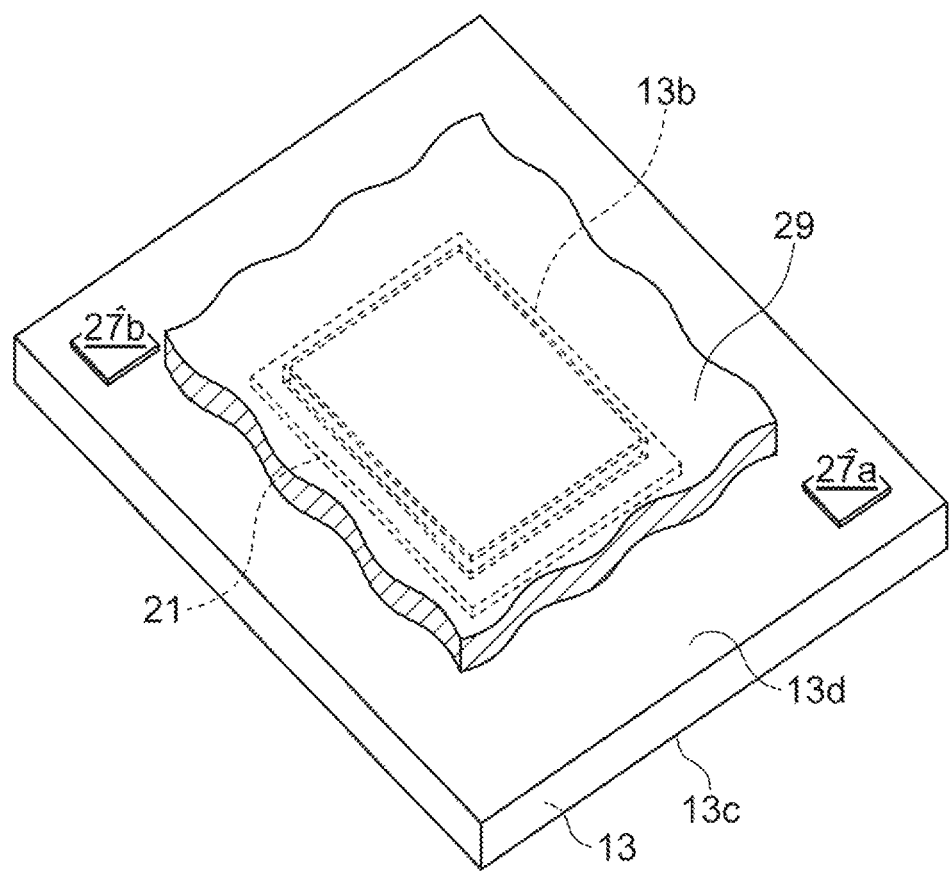
FIG. 12 is a schematic view showing a major step in the method according to the present embodiment.

In the step of mounting a heat sink, as shown in FIG. 12, the heat dissipating part 29 for heat dissipation is mounted on a back face 13*d* of the printed circuit board 13. The heat dissipating part 29 has a size allowing the heat dissipating part 29 to reach the second face 21*b* of the metal piece 21 positioned in the bottom of the second opening 13*b* of the printed circuit board 13, and also has a support face (a support surface 29*a* shown in FIG. 3) allowing the heat dissipating part 29 to come in contact with the second face 21*b* of the metal piece 21. The heat dissipating part 29 works as a support for supporting the second face 21*b* of the metal piece 21. The heat dissipating part 29 may include, for example, copper, aluminum, silver, magnesium, anodized aluminum, and/or ceramics. Heat generated by the semiconductor optical device 15 propagates through a dissipating pass in the second opening 13*b*, which is different from a pass via the insulating portion of the printed circuit board 13, from the semiconductor optical device 15 on the first face 21*a* through the metal piece 21 to the second face 21*b* that is to be in contact with the heat dissipating part 29, and the heat travels in the direction from the first face 21*a* of the metal piece 21 to the second face 21*b*, i.e., the thickness direction, through the metal piece 21. If necessary, an adhesive agent may be used to attach the heat dissipating part 29 to the second face 21*b*.

In the present embodiment, mounting the heat dissipating part 29 is carried out prior to connecting the optical part 25.

Having described and illustrated the principle of the invention in a preferred embodiment thereof, it is appreciated by those having skill in the art that the invention can be modified in arrangement and detail without departing from such principles. We therefore claim all modifications and variations coming within the spirit and scope of the following claims.

What is claimed is:
1. A printed circuit board including:
a first laminate structure including a dielectric core layer, and a metal layer for grounding or wiring, the metal layer thereof being disposed on the dielectric core layer thereof, the first laminate structure having a first opening;
a second laminate structure including a dielectric core layer, and a metal layer for grounding or wiring, the metal layer thereof being disposed on the dielectric core layer thereof, the second laminate structure having a second opening; and
a metal piece having a first face and a second face, the second face being opposite to the first face, the metal piece being held by the first laminate structure and the second laminate structure,
the first laminate structure including pad electrodes arranged on a surface of the first laminate structure along an edge of the first opening,
the metal piece being electrically isolated from the first laminate structure and the second laminate structure,
the first opening of the first laminate structure, the metal piece, and the second opening of the second laminate structure being arranged in a direction of an axis, and
the first opening extending from the surface of the first laminate structure to the first face of the metal piece, and the second opening extending from a surface of the second laminate structure to the second face of the metal piece.

* * * * *